United States Patent [19]

Komaki

[11] Patent Number: 4,627,736

[45] Date of Patent: Dec. 9, 1986

[54] THIN CARD-TYPE ELECTRONIC APPARATUS

[75] Inventor: Shigeki Komaki, Nara, Japan

[73] Assignee: Sharp Kabushiki Kaisha, Osaka, Japan

[21] Appl. No.: 675,251

[22] Filed: Nov. 26, 1984

Related U.S. Application Data

[63] Continuation of Ser. No. 503,541, Jun. 13, 1983, abandoned.

[30] Foreign Application Priority Data

Jun. 15, 1982 [JP] Japan .............................. 57-104373

[51] Int. Cl.$^4$ ...................... G04C 23/02; G06F 1/00; H01H 13/70; H05K 7/00
[52] U.S. Cl. .................................... 368/88; 200/5 A; 361/380; 361/417; 364/708; 368/205
[58] Field of Search ................ 200/5 A, 159 B, 86 R, 200/292; 368/88, 204, 205; 364/708, 709, 710, 711, 712; 235/145 R; 340/365 R; 361/380, 397, 398, 400, 401, 403, 412, 415, 416, 417

[56] References Cited

U.S. PATENT DOCUMENTS

| | | | |
|---|---|---|---|
| 3,290,439 | 12/1966 | Willcox et al. ................... | 178/17 R |
| 4,046,981 | 9/1977 | Johnson et al. ................ | 200/5 A X |
| 4,065,649 | 12/1977 | Carter et al. ..................... | 200/5 A |
| 4,066,851 | 1/1978 | White et al. ....................... | 200/5 A |
| 4,074,118 | 2/1978 | Washizuka et al. ................ | 364/712 |
| 4,096,577 | 6/1978 | Ferber et al. ..................... | 364/712 |
| 4,104,728 | 8/1978 | Kasubuchi ......................... | 364/712 |
| 4,120,039 | 10/1978 | Fischer ............................ | 200/5 A X |
| 4,158,230 | 6/1979 | Washizuka et al. ................ | 364/708 |
| 4,181,964 | 1/1980 | Moore et al. .................... | 200/5 A X |
| 4,197,586 | 4/1980 | Nidiffer ............................ | 361/398 X |
| 4,237,351 | 12/1980 | Boulanger et al. ................ | 200/5 A |
| 4,241,436 | 12/1980 | Bolzt et al. ....................... | 368/88 |
| 4,261,042 | 4/1981 | Ishiwatari et al. ............... | 361/398 X |
| 4,261,049 | 4/1981 | Komiyama et al. ............... | 368/205 |
| 4,342,069 | 7/1982 | Link ................................ | 361/403 X |
| 4,532,575 | 7/1985 | Suwa ............................... | 361/398 X |

OTHER PUBLICATIONS

Goodman, et al, "Integrated Packaging for Transparent Elastic Diaphragm Switch," IBM Technical Disclosure Bulletin, vol. 15, No. 2 (Jul. 1972), pp. 544–545.

Kuntzleman, "Keyboard Transducer", IBM Technical Disclosure Bulletin, vol. 7, No. 12 (May 1965), p. 1170.

Sedaris, et al, "Elastic Diaphragm Switch", IBM Technical Disclosure Bulletin, vol. 14, No. 3 (Aug. 1971), p. 76.

Lester, et al, "Switch," IBM Technical Disclosure Bulletin, vol. 11, No. 11 (Apr. 1969), p. 1564.

Ludeman, et al, "Wrist Worn Terminal," IBM Technical Disclosure Bulletin, vol. 15, No. 11 (Apr. 1973), pp. 3350, 3351.

Geil, et al, "Elastic Diaphragm Switch," IBM Technical Disclosure Bulletin, vol. 13, No. 7 (Dec. 1970), p. 1943.

*Power-Supply Modification Turns Standard Calculator Chip into Unique Product,* EDN, Apr. 20, 1973, pp. 25–26.

A. Asada, *Calculator's Parts are Integrated on a Single Glass Substrate,* Electronics, Feb. 8, 1976, pp. 109–111.

*Primary Examiner*—J. R. Scott
*Attorney, Agent, or Firm*—Birch, Stewart, Kolasch & Birch

[57] ABSTRACT

A thin electronic apparatus comprises as its primary structural components a substrate carrying key counter contacts and a first wiring pattern thereon, and an elastic sheet carrying key symbols on one surface thereof and a second wiring pattern on the other surface thereof. The thin electronic apparatus consists primarily of the substrate bonded to the elastic sheet and electronic components housed in cavities in the substrate.

13 Claims, 4 Drawing Figures

THIN CARD-TYPE ELECTRONIC APPARATUS

This application is a continuation of application Ser. No. 503,541 filed on June 13, 1983, now abandoned.

BACKGROUND OF THE INVENTION

The present invention relates to an improvement of an electronic apparatus, more particularly, to a thin electronic apparatus such as a calculator or a timepiece using both a substrate carrying a printed circuit pattern and an elastic sheet as a cabinet.

FIG. 1 shows a cross sectional view of a conventional electronic calculator. As shown in FIG. 1, movement parts such as a wiring substrate 4, an LSI 5, a liquid crystal display device 6, solar cells 7 or the like and a protecting filter 8 and keys 9, made of rubber, are packaged by an upper panel 1 (an ornamental panel), a cabinet 2 and a lower panel 3. Further, the lower panel 3 is formed with a protrusion for disposing the liquid crystal display device 6 in the lower portion of the device in order to make room for the remaining parts of the electronic calculator. Accordingly, when such a card-type electronic calculator is set on a desk and keys are pushed by a user, the calculator may be unsteady on account of the protrusion and it may be difficult to exactly execute key inputs.

Assembly of such an electronic calculator is complicated because many components are required. Also as a result of the number of components, the thickness of the calculator cannot be thinner.

SUMMARY OF THE INVENTION

With the foregoing prior difficulty in mind, it is an object of the present invention to provide a thin electronic apparatus, such as a calculator or timepiece, reducing the number of components of the apparatus and simplifying assembly thereof.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to an embodiment of the present invention, a thin electronic apparatus comprises substrate means for carrying key counter contacts and a first wiring pattern thereon, and elastic sheet means for carrying key symbols which are printed on one surface of the elastic sheet, the elastic sheet means carrying key contacts and a second wiring pattern on the other surface thereof, wherein the thin electronic apparatus is constructed primarily of the substrate means and the elastic sheet means as layers.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 2:
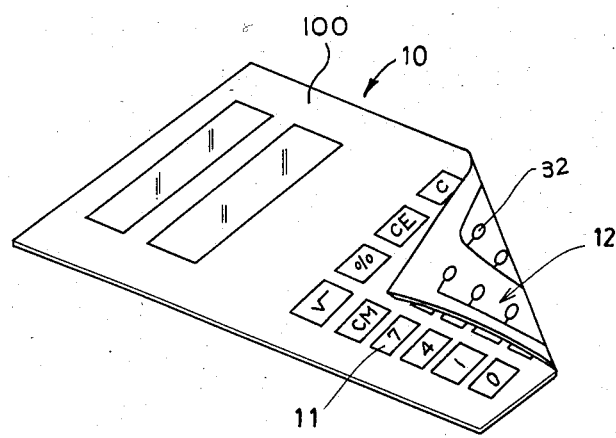
FIG. 2 shows an external view of a plastic sheet and a metal substrate of an electronic apparatus according to an embodiment of the present invention.
Figure 2:
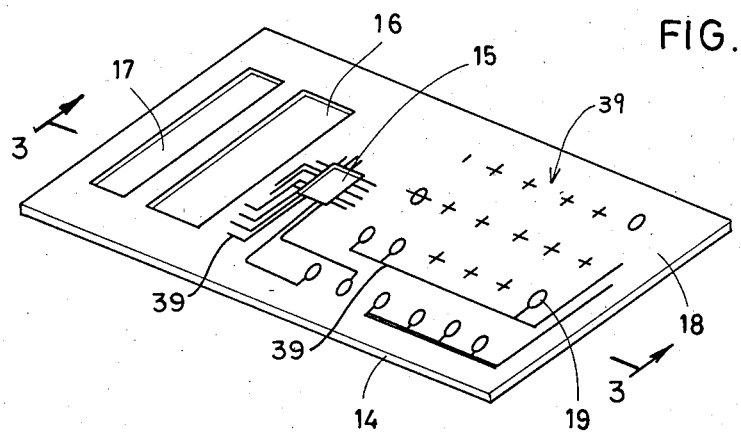
Figure 3:
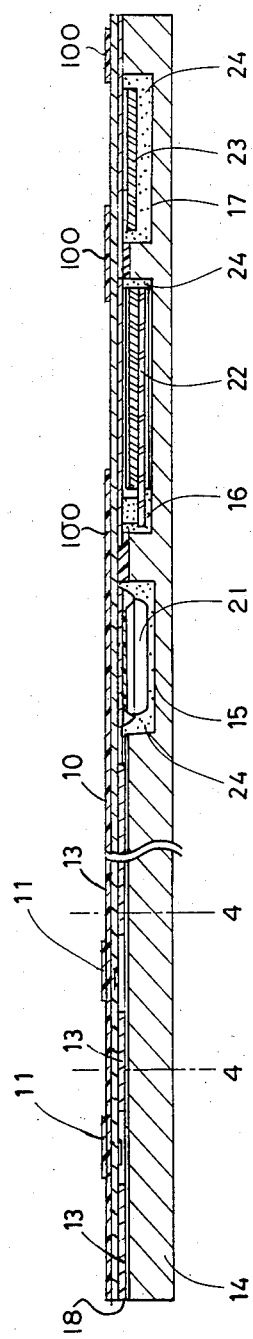
FIG. 3 shows a cross sectional view of an electronic apparatus according to the embodiment of the present invention along line 3—3 of FIG. 2.
Figure 4:
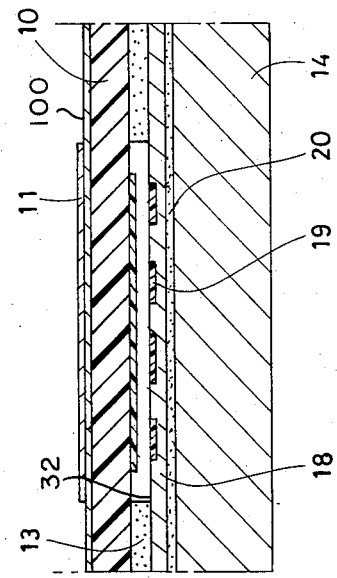
FIG. 4 shows an expanded sectional view of the portion between lines 4—4 of FIG. 3.

FIG. 2 shows an exploded view of an elastic sheet made of, for example plastics and a metal substrate used for an electronic calculator as an electronic apparatus according to an embodiment of the present invention. FIG. 3 shows a sectional view of an electronic apparatus according to an embodiment of the present invention. FIG. 4 shows an enlarged sectional view taken along lines 4—4 of FIG. 3. In the drawings, a flexible transparent sheet 10 is made of a vinyl chloride, a polyester or the like. The upper surface of the sheet 10 has printed thereon an ornamental coating or 100 (FIGS. 2-3) film except at the surface portion opposed to solar cells 23 and liquid crystal display device 22 packaged in the metal substrate 14 which will be later described. Further, key symbols 11 are printed on the upper surface of the sheet 10. Key contacts 32 and a wiring pattern 12 are printed opposite to the key symbols 11 on the lower surface of the sheet 10 by using a conductive ink or the like. A hot melt adhesive 13 of suitable thickness (as shown in FIGS. 3 and 4) is coated on the under surface of layer 10 except in the region of the key contacts 32. Adhesive layer 13 is spaced about the periphery of each key contact for the purpose of forming key spacers on the sheet 10.

On the other hand, concavities 15, 16 and 17 for packaging or accommodating electronic components such as an LSI 21, the liquid crystal display device 22, the solar cells 23 or the like, respectively, are formed in a substrate 14. The substrate 14 may be stainless steel and the concavities may be formed by etching. Key counter contacts 19 and a wiring pattern 39 are printed on an insulating film 18 such as polyimide. The wiring pattern 39 may be electrically connected in a suitable pattern between the above electrical components (i.e., 21, 22 and 23) and the key counter contacts 19. The components can also be connected to wiring pattern 12 on sheet 10, as seen in FIG. 3. The film 18 is adhered by an adhesive 20 on the substrate 14.

As stated above, the concavities 15, 16 and 17 in the stainless steel substrate 14 having the above construction receive the LSI 21, the liquid crystal display device 22, and solar cells 23, respectively. The electronic components are fixed in substrate 14 by using a rubber type filler 24 which also absorbs mechanical shock. Terminals of the electronic components are connected to desired contacts of the wiring pattern 39 on the polyimide film 18 or patterns 12 on layer 10. As shown in FIG. 3, after the plastic sheet 10 is put on the substrate 14, the substrate 14 is heated and pressed against sheet 10 for adhering the two together.

Figure 1:
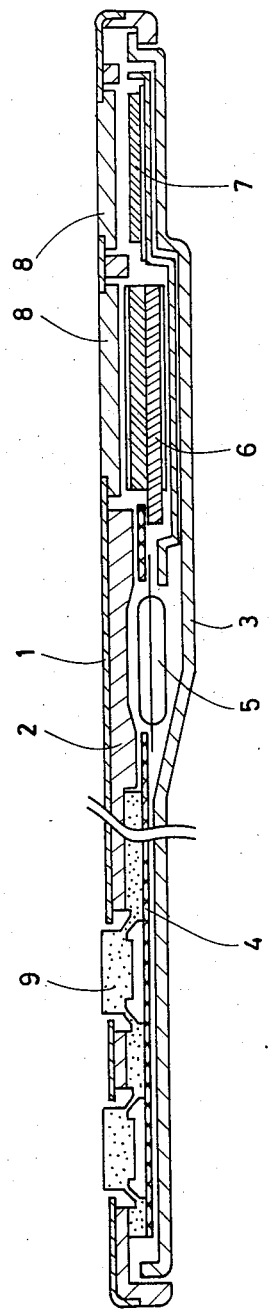
FIG. 1 shows a cross sectional view of a conventional electronic calculator.

In the above construction, the layers of the electronic calculator can be provided with only the sheet 10 made of plastics, the stainless steel substrate 14 and the polyimide film 18. Conventional components such as the upper panel 1, the cabinet 2, the lower panel 3, a substrate 4, an acrylic filter 8 and rubber Keys 9 or the like as shown in FIG. 1, can be replaced and, to some extent, eliminated. Accordingly, the assembly of such devices can be very simplified, the electronic apparatus can be made thinner and the bottom surface of the electronic apparatus can be flat.

A card-type electronic apparatus of the present invention comprises essentially a metal substrate housing electronic components, and an elastic sheet made of, for example plastics printed with an ornamental coating or film and a wiring pattern or the like formed thereon. Accordingly, many components of a typical electronic apparatus can be eliminated and the inventive electronic apparatus can be assembled more easily.

The substrate 14 may also be made of insulating material, as such epoxy resin or phenol resin or the like, and the wiring pattern 39 and the key counter contacts 19 may be printed directly thereon.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic apparatus consisting essentially of:
    a substrate having a first wiring pattern on a first surface thereof, said first wiring pattern including first key contacts and first electrically conductive paths connected to said first key contacts;
    at least one recess in said first surface of said substrate for receiving an electronic component;
    at least one electronic component positioned within said at least one recess, said electronic component having electrical conductor leads;
    a flexible layer having a second wiring pattern on a first surface thereof, said second wiring pattern comprising second key contacts and second electrically conductive paths connected to said second key contacts;
    said flexible layer being positioned on said substrate such that said first surface of said flexible layer faces said first surface of said substrate and said first key contacts are aligned with said second key contacts and said flexible layer covers said at least one recess;
    spacer means interposed between said substrate and said flexible layer at least adjacent said first and second key contacts to space said key contacts from each other; and
    power supply means;
    wherein said electrical conductor leads of said electronic component and said power supply means are each electrically engaged with at least one of said first and second electrically conductive paths of said first and second wiring patterns.

2. An electronic apparatus as in claim 1, wherein said substrate is rigid.

3. An electronic apparatus as in claim 1, further comprising an electrically insulating layer interposed between said substrate and said first wiring pattern.

4. An electronic apparatus as in claim 1, comprising filler material within said at least one recess and surrounding said electronic component.

5. An electronic apparatus as in claim 1, wherein said spacer means comprises a bonding layer for securing said flexible layer to said substrate.

6. An electronic apparatus as in claim 1, comprising indicia on a second surface of said flexible layer in alignment with said second key contacts.

7. An electronic apparatus as in claim 1, wherein said flexible layer comprises plastic sheet such as vinyl chloride film or polyester film.

8. An electronic apparatus as in claim 1, comprising a plurality of recesses in said substrate, at least a first said recess having a solar cell, which comprises said power supply means, therewithin and at least a second said recess having a visual display therewithin, wherein said flexible layer is transparent at least at the portions thereof aligned with said first and second recesses.

9. An electronic apparatus as in claim 8, wherein said apparatus is an electronic calculator.

10. An electronic apparatus as in claim 1, comprising a plurality of recesses in said substrate, at least a first said recess having said power supply means therewithin and at least a second said recess having a visual display therewithin, wherein said flexible layer is transparent at least at the portion thereof aligned with said first recess.

11. An electronic apparatus as in claim 10, wherein said apparatus is a timepiece.

12. An electronic apparatus as in claim 1, wherein a second surface of said substrate is substantially flat for stably supporting said apparatus.

13. An electronic apparatus as in claim 1, wherein said substrate comprises stainless sheet and insulative film such as polyimide film.

* * * * *